United States Patent [19]

Mitchell et al.

[11] 4,245,185
[45] Jan. 13, 1981

[54] SOLID STATE CIRCUIT BREAKER WITH THREE PHASE CAPABILITY

[75] Inventors: James T. Mitchell, Lima; William W. Billings, Cridersville, both of Ohio

[73] Assignee: Westinghouse Electric Corp., Pittsburgh, Pa.

[21] Appl. No.: 23,368

[22] Filed: Mar. 23, 1979

[51] Int. Cl.³ ............................................. G05F 3/04
[52] U.S. Cl. .................................... 323/235; 361/3; 361/93; 323/241; 323/244; 323/277
[58] Field of Search ................... 307/252 T, 252 UA; 323/9, 18, 21, 19, 24; 361/3–7, 93, 100

[56] References Cited

U.S. PATENT DOCUMENTS

| | | | |
|---|---|---|---|
| 3,443,204 | 5/1969 | Baker | 361/3 X |
| 3,532,900 | 10/1970 | Rhyne | 361/100 |
| 3,555,292 | 1/1971 | Henry | 361/6 |
| 3,557,381 | 1/1971 | Henry | 361/6 |
| 3,644,753 | 2/1972 | Ginsberg | 307/252 UA |
| 3,811,073 | 5/1974 | Shuey et al. | 323/24 X |
| 3,925,688 | 12/1975 | Kalfus | 307/252 UA |
| 3,925,709 | 12/1975 | Mitchell et al. | 323/9 X |
| 4,139,878 | 2/1979 | Shuey | 361/93 |

*Primary Examiner*—A. D. Pellinen
*Attorney, Agent, or Firm*—G. H. Telfer

[57] ABSTRACT

A solid state circuit breaker is provided with circuitry for permitting off/on/reset operations actuated by mechanical toggle switch for close simulation of magnetic circuit breaker operation in three phase or other multiphase systems. A power continuity feature is provided for load power by locating the control switch so that it opens all of the circuit except the static power switch branch. The control switch is located between two of the supply voltage phases and the power supply for the control circuitry. The correct zero crossover of one phase is utilized to produce turn-on at zero degrees of that one phase while the other two phases are respectively at minus 120° and plus 120° without any significant impairment of overall circuit breaker performance. An overcurrent protection system is included that uses optical isolators with reduced sensing voltages developed directly from terminals of the power switch elements.

5 Claims, 8 Drawing Figures

SOLID STATE CIRCUIT BREAKER WITH THREE PHASE CAPABILITY

BACKGROUND AND SUMMARY OF THE INVENTION

This invention relates to solid state circuit breakers for controlling the supply of power from an AC supply to a load and particularly to such circuit breakers suitable for application in three-phase systems.

Copending application Ser. No. 023,361, filed Mar. 23, 1979, by Billings and Luebrecht and assigned to the present assignee (Case W.E. 47,975) discloses an AC solid state circuit breaker achieving the multiple objectives of good simulation of electromechanical circuit breaker characteristics, including the provision of a manual control switch for toggling between off, on and reset conditions, while doing so with apparatus whose size and weight are minimized and reliability is maximized. The disclosure of the copending application is incorporated herein by reference including the background material referenced therein.

In the apparatus of the copending application there is provided means for providing a power removal feature for load power by locating a manual control switch so that it opens essentially all of the circuit except the static power switch branch between the source and the load. This provides a high degree of failsafe protection for the apparatus. A power continuity feature is provided by means for zero crossover synchronization both upon power up and power down conditions. A circuit lock out feature is used so that on power up or turn on, operation is delayed until the occurrence of an internal power ready condition. On power down or turn off, there is means for circuit retention subsequent to switch opening and internal power removal in order to accomplish load turn off at a desired zero crossover point of the load power through the power switch. In addressing the requirements for a solid state circuit breaker to operate in a three phase system, or some other number of a plurality of phases, there are additional complications addressed by the present invention in order to assure effective circuit breaker operation including the power continuity feature.

In accordance with the present invention, a solid state circuit breaker is provided with circuitry for permitting off/on/reset operations actuated by a mechanical toggle switch for close simulation of magnetic circuit breaker operation in three phase or other multiphase systems. The power continuity feature is provided for load power by locating the control switch so that it opens essentially all of the circuit except the static power switch branch. The control switch is located between two of the supply voltage phases and the power supply for the control circuitry. Zero crossover synchronization means is provided to make sure the power on and power off events occur at optimum points in the applied AC voltage waveform in order to reduce transient and saturation effects in the loads on the circuit. For example, a straightforward application of known power controller techniques for three phase apparatus would entail means for turning on each phase separately, at 120° intervals, at its correct zero crossover point. This would require the use of three zero crossover circuits and also associated apparatus including the oscillators for the drive circuits of the AC switches. In so doing, there would be a substantial increase in the size and cost of the circuit breaker that would be undesirable. In accordance with this invention, the correct zero crossover of one phase is utilized to produce turn-on at zero degrees of that one phase while the other two phases are respectively at minus 120° and plus 120° without any significant impairment of overall circuit breaker performance.

Additionally, apparatus in accordance with this invention can be made for three phase operaton over any of a wide range of frequencies (such as 60 Hz to 400 Hz) while at the same time preserving the capability to be operated in a single phase system so that a single solid state circuit breaker can be manufactured and supplied that permits a wide range of applications by the user.

In the course of achieving the primary purposes of the present invention, there have been encountered specific improvements in parts of the overall power controller or circuit breaker that are generally applicable in such solid state apparatus. In particular, an overcurrent protection system is included that utilized optical isolators with reduced sensing voltages developed directly from terminals of the power switch elements that has been found generally useful and highly efficient.

DESCRIPTION OF THE PREFERRED EMBODIMENTS

Figure 1:
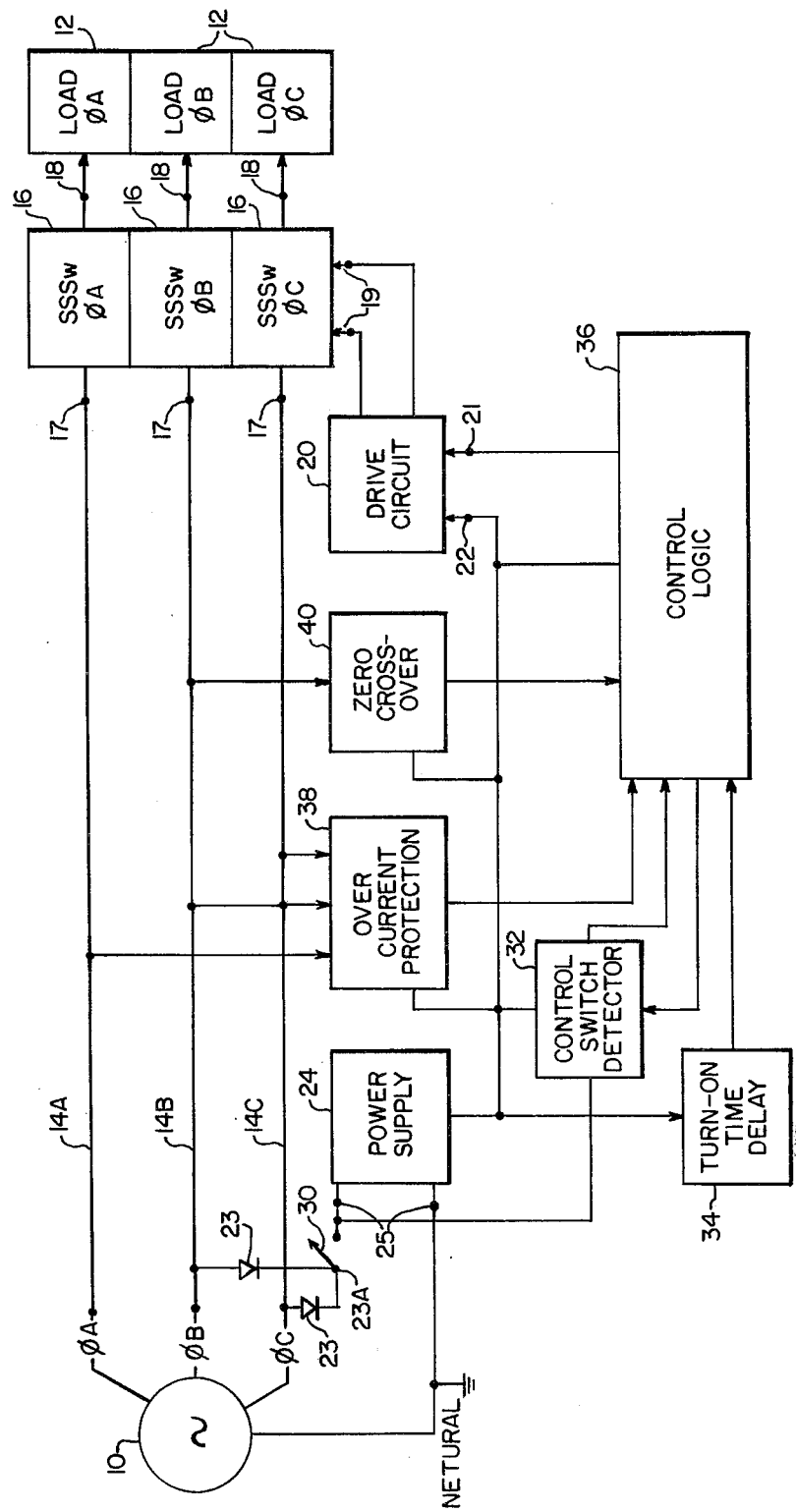
FIG. 1 is a functional block diagram of apparatus in accordance with an embodiment of the present invention.

Referring to FIG. 1, a three phase solid state circuit breaker is illustrated in a one-line diagram for controlling the supply of power from a three phase AC supply 10 to loads 12 on respective AC lines 14A, 14B and 14C referred to as phases A, B, and C. For each phase there is a solid state switch (SSSw) 16, sometimes referred to as a static power switch or the like, having supply and load terminals 17 and 18 connected respectively to each phase of the supply and loads associated with that phase. The solid state switches 16 also have drive terminals 19 for the selective application of predetermined drive signals from drive circuit 20 to alter the conduction state of the switches 16. As will be seen in FIG. 2 the static switches 16 together comprise three sets of pairs of SCR's connected in inverse parallel configurations to provide full cycle conduction paths for load currents in all three phases.

The required DC voltage levels in the internal circuitry are provided by a power supply 24 shown connected at terminals 25 between two of the AC supply voltage phases (arbitrarily shown as phase B and C) and to a reference potential (ground or neutral). As shown in the example of FIG. 1, phases B and C are each connected through respective diodes 23 to a common point 23A. Between point 23A and the power supply 24 is located a manually operable control switch 30 for giving the apparatus the character of a circuit breaker. The power supply circuit 24 together with diodes 23 comprise elements for the conversion of AC power to DC power with whatever filtering and regulation is desirable. Consistent with preferred practice, the apparatus is powered merely from the AC line without requiring any separate DC power supply unassociated with the line. Thus, this apparatus may be referred to as "self powered" or "self energized".

The control switch 30 between the AC supply 10 and the power supply 24 enables deenergization of the circuit breaker, except for the solid state switches, to provide a highly reliable means of removing load power. There is provided a means for detecting the closing of the control switch 30, shown in FIG. 1 as a control switch detector 32. There is also a turn-on time delay means 34 to insure that upon the control switch 30 being closed the power supply 24 can reach a voltage level adequate to continuously operate. Signals from the control switch detector 32 and the turn-on time delay 34 are supplied to a control logic circuit portion 36. The control logic circuit 36 provides signals to the drive circuit 20 in accordance with inputs it receives from the control switch detector 32, the turn-on time delay circuit 34, an overcurrent protection circuit 38 and a zero crossover circuit 40.

The zero crossover circuit 40 is to provide accurate turn-on and turn-off synchronization for the circuit breaker with respect to the AC supply voltage zero crossover. Despite the presence of three phases, it is only necessary in accordance with this invention to use the zero crossover of a single phase as the synchronizing parameter and to permit the other two phases to be respectively plus 120° and minus 120° out of phase with that on which the monitored zero crossover occurs.

The overcurrent protection circuit 38 provides inverse time overload tripping in the event of excessive loads or load faults on any one of the individual phases. The protection circuit 38 is generally of such a nature that it receives signals from each of the three phases for comparison with a reference level in determining the state of the signal to be applied to the control logic circuit.

An additional function that can be provided in accordance with known technology, not shown, is an indication function for indication of on or tripped conditions of the breaker.

Figure 2:
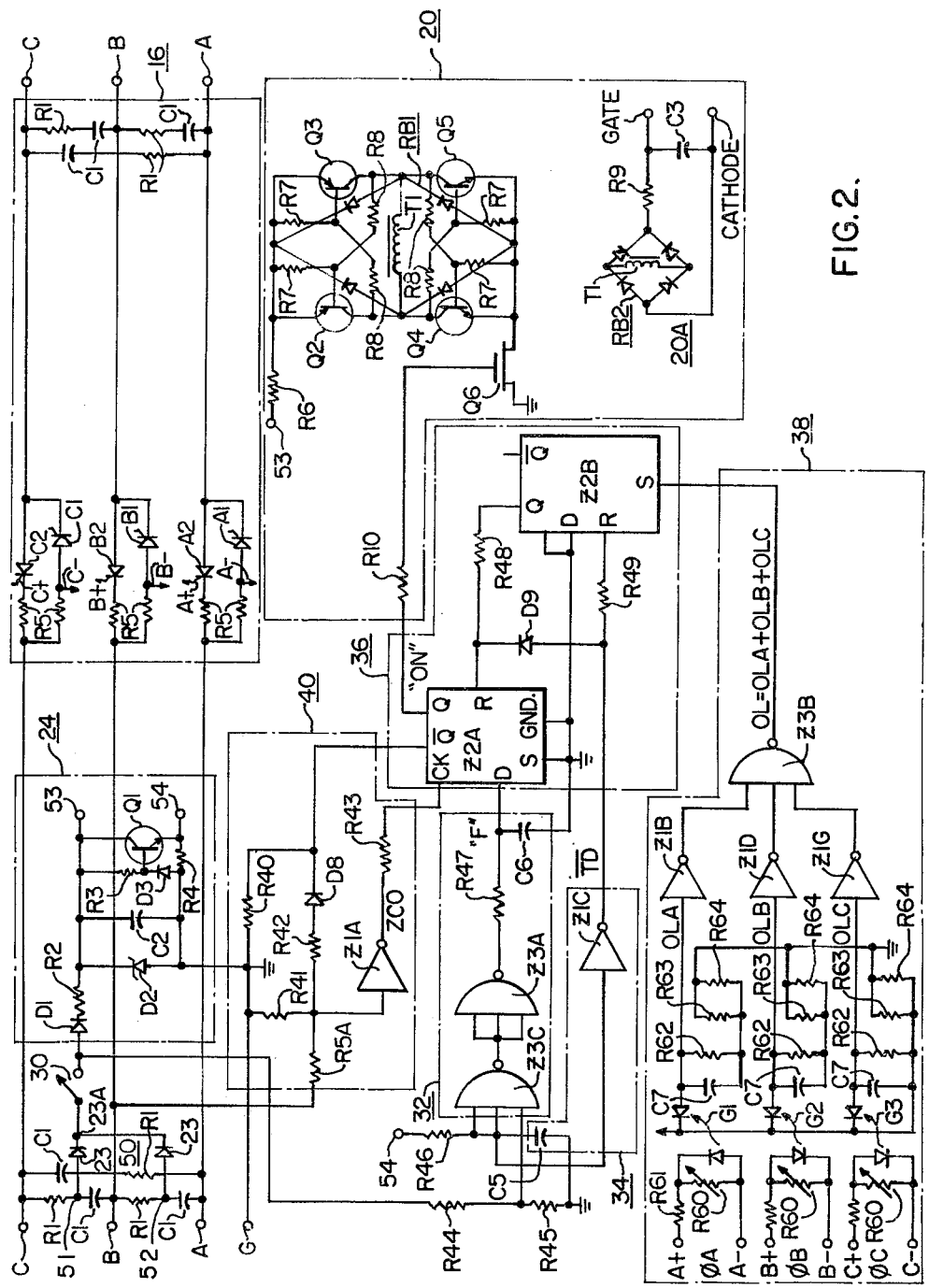
FIG. 2 is a detailed circuit schematic of an embodiment of this invention.

The nature and operation of circuit breakers in accordance with this invention will be better understood by reference to FIG. 2 which shows a specific embodiment in accordance with this invention although the circuit may be modified in accordance with known practice from the principles here presented. An understanding of the nature and operation of apparatus in accordance with this invention, including that of FIG. 2, will be enhanced by reference to the description contained in the copending application referred to above, in which a single phase embodiment is shown.

The control switch 30 is connected between the phase conductors A, B and C and the power supply 24 by an input network 50 comprising a resistor R1 and a capacitor C1 between each pair of phases. Two diode rectifiers 23 are respectively connected to network points 51 and 52 and to common point 23A. The power supply 24 is energized and deenergized by the closing and opening of the single pole, single throw control switch 30 in order to convert the AC line voltage to a DC power level to energize the internal circuit breaker circuitry. Higher voltage, +DC, is produced at terminal 53 and a lower DC voltage (+12V) at terminal 54. The AC line voltage is rectified and filtered to provide the DC supply voltage and also a regulated +12 volt DC for logic circuits. Because of the different nature of the overcurrent protection circuit in this embodiment, from that of the copending application, it is not required that there be an additional lower regulated DC voltage for its operation. The power supply circuit is designed for working in both three phase and single phase applications and also to be usable with AC power sources of any frequency over a wide range, such as 60 hertz through 400 hertz, by employing resistive, as opposed to reactive, elements for voltage dropping. Individual components of power supply circuit 24 are further identified, by way of example, in Component Table III below.

The zero crossover circuit 40 is substantially in accordance with that of the copending application with the addition of resistor R40 connected between ground and diode D8. In the instant embodiment, this circuit senses the AC source voltage appearing between line terminals B and A generates a quasi-squarewave whose positive-rising edges (which are the zero crossover operating times) coincide with the 180° zero crossings of $V_{AB}$ as shown in the waveform A of FIG. 3. Selection of only one of the zero crossover points is sufficient for the power continuity feature which reduces on saturation and transients with electromagnetic loads.

It is to be noted that AC input signal to zero crossover circuit 40 is applied through R5A even if the control switch 30 is not closed so that on turn-off proper synchronization with the 180° zero crossover will be maintained. Also, deliberate earlier occurrence of the zero crossover signal positive leading edge is obtained in the on state to preclude extra half cycle load power by leading power factor load currents. This is accomplished by loading the zero crossover input sensing node in the on state by the resistor R8 and diode D8 to the off signal which is low when the circuit breaker is on.

Previously known solid state power controller designs for three phase apparatus used individual zero crossover sensing and independent closing on each phase. This not only adds considerable complexity to the circuit but causes a significant amount of saturation at turn-on with three phase loads because it takes two-thirds of the first cycle of load power to have balanced power in the loads. In contrast, by the present invention, at turn-on all three phase voltages are applied to the load at the same instant with minimal, controlled, turn-on transient line currents resulting.

The control logic circuit 36 is substantially in accordance with the copending application and provides a logic "ON" signal that turns the circuit breaker on and off in response to the control switch and the overcurrent protection circuit. Circuit 36's inputs consist of the control signal from the swith detector circuit 32, the zero crossover signal, a trip lockout from the overcurrent protection and the plus DC supply. The detector 32's control signal is generated as a quasi-squarewave from the AC control switch signal using gates Z3C and Z3A. Referring to the waveforms of FIG. 3 it is seen how the "F"; signal timing and time lag at the D input of flip-flop Z2A is designed to assure the "F" signal always is positive at the zero crossover operating times when the control switch 30 is closed and the turn-on time delay has elapsed. It is therefore seen that the zero crossover circuit 40, the control switch detector circuit 32, the turn-on time delay circuit 34 and the control logic circuit 36 together cooperate to produce an "on"

signal from the control logic circuit 36 to the drive circuit 20 only upon the closing of the control switch 30 and after the time delay so the power supply 34 is up to a level permitting continuous operation, and the correct zero crossover occurs.

The overload protection circuit 38 provides inverse type overload tripping in the event of excessive loads or load faults in any one or all of the three phases. The overload signal OL is provided to the control logic circuit 36 in a manner such that if there is an overcurrent on any one phase all phases are tripped. This circuit uses optical isolation elements G1, G2 and G3 for each of the phases in the manner generally described in U.S. Pat. No. 3,925,709, which should be referred to. However, a significant modification in the three sensing circuits reduces the power switch losses at high current ratings. This modification consists of utilizing a gate-to-cathode voltage drop (across terminals A+ and A−, B+ and B−, C+ and C− in switch circuit 16), which is a small magnitude voltage of about 0.88 volts, to obtain a portion of the DC sensing voltage for overload sensing. The signal identification at the input of the sensing circuits corresponds to the points indicated in the power switch circuit portion 16. This means that the resistance value of the shunt resistors R60 can be reduced about 50% of the value required by the previous circuit that employs current sensing in accordance with U.S. Pat. No. 3,811,073, with a corresponding decrease in switch voltage drop and increase in efficiency.

Schmitt trigger gates Z1B, Z1D and Z1E and gate Z3B cooperate to provide the overload fault signal which actuates the trip lockout Z2B of the control logic circuit 36. The trip lockout signal then causes Z2A to be reset or turned off, removing the drive signal to the static power switch. The trip lockout flip-flop Z2B remains in the set mode until it is reset by opening the control switch 30.

The static power switch 16 is generally in accordance with the copending application and its drive circuit 20 uses the same concepts employing a Royer oscillator with its transistors connected in a bridge configuration. This allows the use of the single winding primary with multiple secondaries for the oscillator transformer.

Circuit portion 20A is one of six gate drive circuits which are each connected across the gate and cathode of each SCR of power switch 16. Each uses one part of a six section secondary winding of transformer T1.

Figure 3:
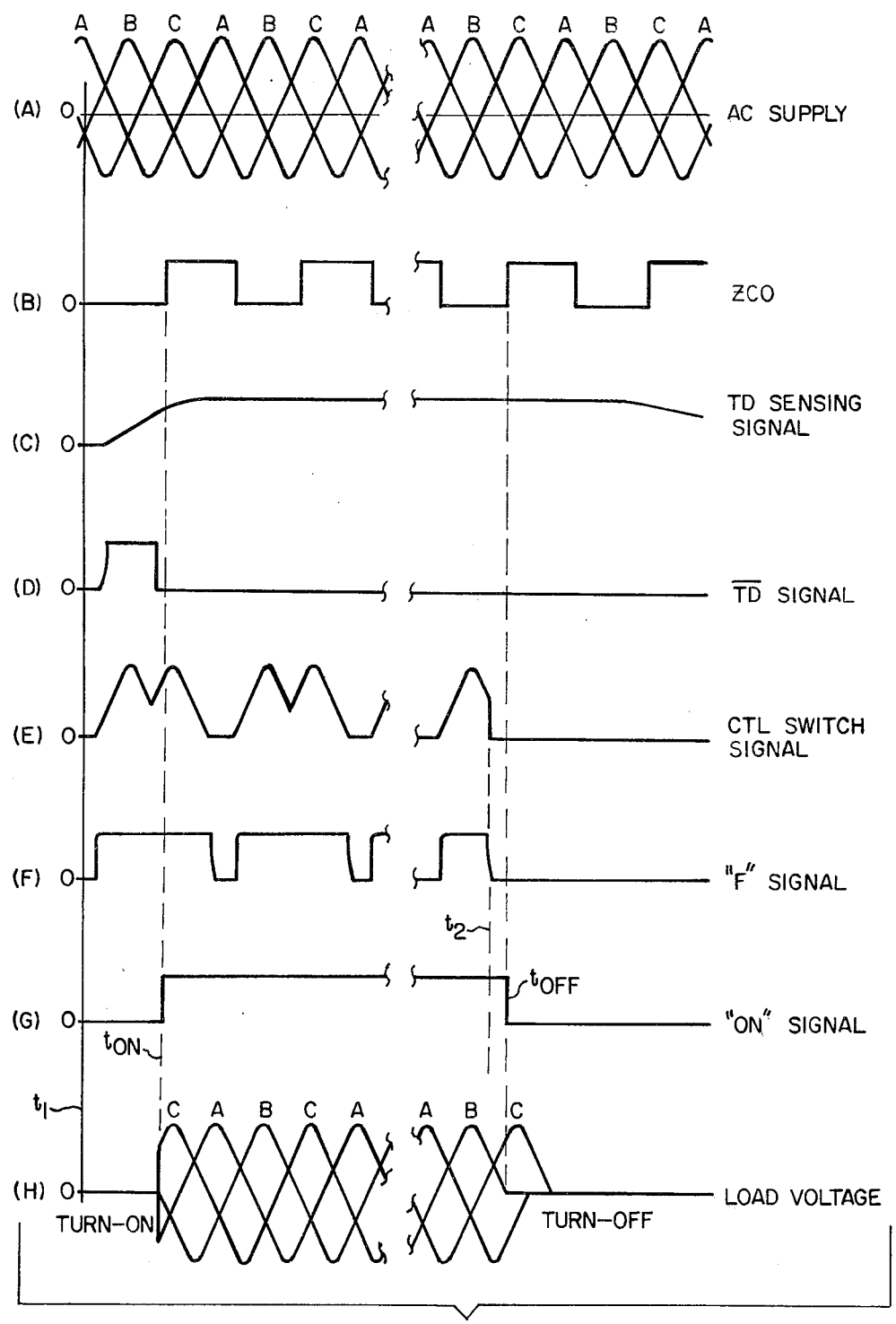
FIG. 3 is a set of waveforms illustrative of the operation of apparatus in accordance with this invention.

Reference to the waveforms of FIG. 3 shows the sequencing of the various supply and control signals that result in the operation of the circuit. Waveform A is the multiphase AC supply. Waveform B is the zero crossover signal (ZCO), required for only one phase (phase B). Waveform C is the time delay sensing signal TD for circuit 34 while waveform D is the time delay signal itself $\overline{TD}$ supplied by circuit 34 to the logic circuit 36. Waveform E is the control switch signal from 30 and waveform F is the switch detector outut signal. Waveform G is the "ON" signal to the drive circuit. Waveform H is the AC load voltage.

If the control switch 30 is closed at time t1 and opened at a time t2, it can be seen how the load power is applied, with delay for correct synchronization, at $t_{on}$ and removed at $t_{off}$. Phases A and C terminate within a half cycle at their zero points after $t_{off}$.

The following tables present data on the performance of the circuit and suitable component value as has been utilized in the operation of the circuit.

TABLE I

Figure 4:
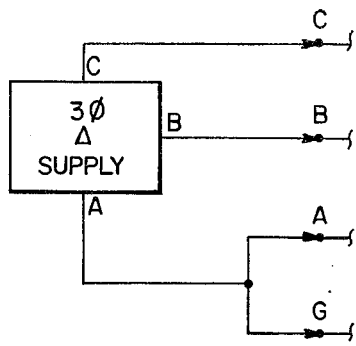
FIGS. 4 throgh 8 illustrate input connections for embodiments of the invention to show the versatility of applications to which the invention may be applied.
Figure 5:
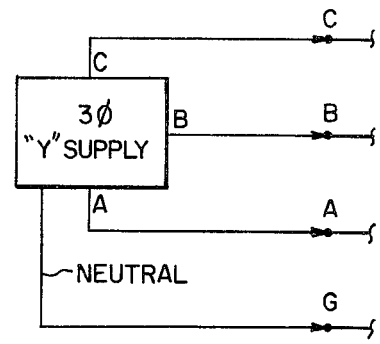
Figure 6:
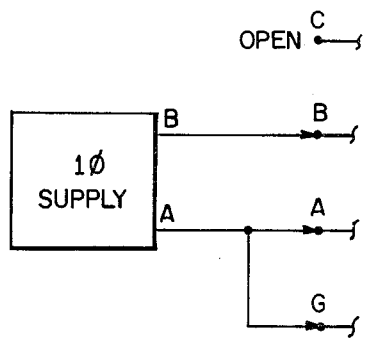
Figure 7:
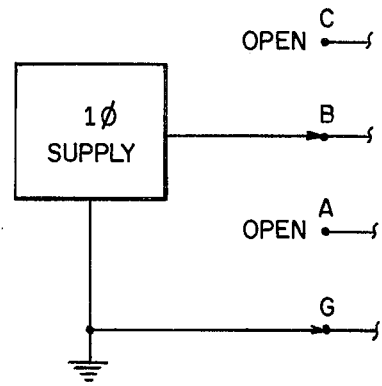
Figure 8:
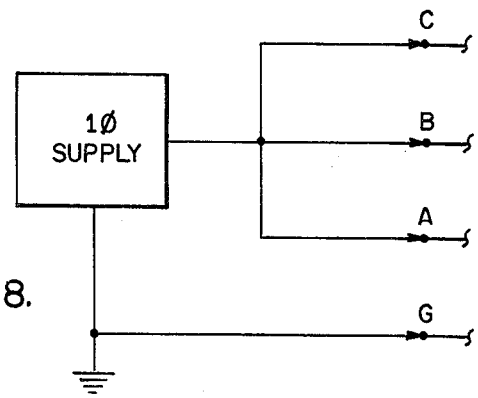

This table presents how the circuit in accordance with this invention, such as FIG. 2, is connectable for use in various three phase and single phase applications:

| Type Designation | Circuit Configuration | Input Power Terminals | Terminal "G" Connection |
|---|---|---|---|
| I (FIG. 4) | 3φ, 115V/L-L-Δ | A-B-C | A |
| II (FIG. 5) | 3φ, 208V/L-L-Y | A-B-C | Neutral |
| III (FIG. 6) | 1φ, 115V & both lines controlled | A-B | A |
| IV (FIG. 7) | 1φ, 115V & one line controlled | B-Gnd | Gnd |
| V (FIG. 8) | 1φ, 115V, 3X current rating | (A to B to C)-Gnd | Gnd |

FIGS. 4 through 8 respectively illustrate connections at input terminals C, B, A and G for circuit types I through V.

TABLE II

The following data is actual performance data of a circuit in accordance with FIG. 2 that has been made and tested:

| | |
|---|---|
| Temperature Ambient Range tested | −25° C. to +75° C. |
| AC Source Voltage Range | 80 VRMS to 135 VRMS |
| AC Source Frequencies | 60 Hz and 400 Hz |
| SSCB Circuit/Load Configurations | All 5 types (Table I) |
| SSCB Dissipation/Efficiency at 10A/120V/3φ | 45.3W/98.8% |
| "OFF" State Dissipation at 10A/120V/3φ | .04 W* |
| "Tripped" State Dissipation at 10A/120V/3φ | 2.10W* |
| DC Power Supply Voltage: | |
|   at point 53 (+DC) | 50 V. |
|   at point 54 | 12 V. |

*Includes Power Switch Leakage Dissipation

TABLE III

The following are suitable components used in the circuit of FIG. 2 presented by way of further example:

| Input Network 50 and Power Supply 24 | |
|---|---|
| R1 | 47 ohms, each |
| C1 | 0.01 mf. |
| D1 | 1N649 |
| R2 | 1000 ohms |
| D2 | 70 V. Zener |
| C2 | 22 mf. |
| R3 | 50,000 ohms |
| D3 | 13 V. Zener |
| Q1 | 2N3501 |
| R4 | 10,000 ohms |
| Static Switch 16 and Drive Circuit 20 | |
| All SCR's | 2N3899 each |
| Q2 and Q3 | 2N5680 each |
| Q4 and Q5 | 2N3019 each |
| Q6 | 2N6660 |
| RB1 and RB2 | VE 18X each |
| R5 | 0.03 ohm each |
| R1 | 47 ohms |
| C1 | 0.01 mf. |
| R6 | 200 ohms |
| R7 | 5000 ohms each |
| R8 | 51,000 ohms each |
| R9 | 22 ohms each |
| C3 | 0.068 mf. each |
| R10 | 10,000 ohms |
| Logic 36 and Control Circuits 32, 34, 38 & 40 | |
| Z1A, Z1B, Z1C, Z1D, Z1D and Z1E | Each a part of MC14584B hexagonal Schmitt trigger |
| Z2A and Z2B | Each a part of MC14013B Dual "D" Flip-Flop |

TABLE III-continued

The following are suitable components used in the circuit of FIG. 2 presented by way of further example:

| | |
|---|---|
| Z3A, Z3B and Z3C | Each a part of MC14023B Triple NAND |
| R40 | 4,700 ohms |
| R5A | 500,000 ohms |
| R41 | 250,000 ohms |
| R42 | 50,000 ohms |
| R43 | 500,000 ohms |
| D8, D9 | 1N914 |
| R44 | 1 Meg.ohm |
| R45, R46, R47, R48 & R49 | 500,000 ohms each |
| C5 | 0.1 mf. |
| C6 | 200 pf. |
| G1, G2, G3 | 9N23 each |
| R61 | 40 ohms each |
| C7 | 2.2 mf. each |
| R62 | 2 ohms each |
| R63 | 18,000 ohms each |
| R64 | 24,000 ohms each |

It is therefore shown that effective circuit breaker performance is achieved from a single versatile unit in single or multiphase applications. Specific forms of the apparatus may be varied from that shown by way of example herein using known circuitry techniques.

We claim:

1. A solid-state circuit breaker for alternating current applications comprising:
   a static power switch for connection in multiphase paths between an AC voltage supply and loads;
   power supply means for developing DC voltage from the applied AC voltage supply;
   a manually operable control switch connected between the supply line and said supply means;
   zero crossover circuit means with connections both with said supply line directly and with said supply line only through said control switch and said power supply means for respectively producing a first signal indicative of the zero crossover of one phase of the AC voltage supply and also a second signal indicative that the load circuit is off;
   turn-on time delay circuit means for producing a signal indicative of the power supply means having achieved full operating capability after the closing of said control switch;
   switch detector circuit means for producing a signal in response both to the closing of said control switch and the occurrence of said time delay signal;
   control logic means for responding to the occurrence of said signals in a manner to produce an ON signal only when said zero crossover signal occurs and said switch detector signal occurs;
   drive circuit means responsive to said ON signal of said control logic means for application of signals to said power switch to initiate conduction thereof of all of said multiphase paths.

2. The invention of claim 1 further comprising:
   overload protection circuit means responsive to an over load condition in said load circuit to produce a signal disabling said control logic from the production of an ON signal.

3. The invention of claim 2 wherein:
   said protection circuit comprises optical isolation means for each phase with current sensing according to voltage drops developed across resistors connected with inverse parallel SCR's in said static power switch.

4. A solid-state circuit breaker for alternating current applications comprising:
   a static power switch for connection between an AC voltage supply and a load, said static power switch comprising a pair of SCR's connected in an inverse-parallel configuration, each of said SCR's having a cathode, an anode and a gate terminal;
   first and second shunt resistors connected respectively in series with each of said SCR's;
   one of said SCR gate electrodes being connected directly to one side of a current sensing device whose other side is connected to the point between the other of said SCR's and its shunt resistor.

5. The invention of claim 4 wherein:
   said current sensing device is a light emitting diode comprising part of an overcurrent protection circuit for said circuit breaker.

* * * * *